(12) United States Patent
Shamir et al.

(10) Patent No.: US 10,512,052 B2
(45) Date of Patent: Dec. 17, 2019

(54) TIMING SYNCHRONIZATION OF SELF-POWERED POWER SENSORS AND A CENTRAL CONTROLLER COLLECTING SAMPLES THEREFROM

(71) Applicant: Panoramic Power Ltd., Kfar-Saba (IL)

(72) Inventors: Adi Shamir, Kidron (IL); Daniel Aljadeff, Kiriat Ono (IL)

(73) Assignee: Panoramic Power Ltd., Kfar-Saba (IL)

( * ) Notice: Subject to any disclaimer, the term of this patent is extended or adjusted under 35 U.S.C. 154(b) by 0 days.

(21) Appl. No.: 15/938,590

(22) Filed: Mar. 28, 2018

(65) Prior Publication Data

US 2019/0037507 A1   Jan. 31, 2019

Related U.S. Application Data

(60) Provisional application No. 62/537,324, filed on Jul. 26, 2017.

(51) Int. Cl.
*H04W 56/00*   (2009.01)
*H04B 1/04*    (2006.01)
*G01R 21/133*  (2006.01)

(52) U.S. Cl.
CPC ........ *H04W 56/001* (2013.01); *G01R 21/133* (2013.01); *H04B 1/04* (2013.01)

(58) Field of Classification Search
CPC ...... G01R 21/133; H04B 1/04; H04W 56/001
See application file for complete search history.

(56) References Cited

U.S. PATENT DOCUMENTS 3,517,311 A    6/1970  Wasielewski et al.
4,709,339 A   11/1987  Fernandes
(Continued)

FOREIGN PATENT DOCUMENTS

EP   1703289 B1   11/2010
GB   2338790 A    12/1999
(Continued)

OTHER PUBLICATIONS

International Search Report and Written Opinion of International Searching Authority for PCT/US2018/025209, ISA/RU, Moscow, Russia, dated Jul. 12, 2018.
(Continued)

*Primary Examiner* — Manuel A Rivera Vargas
*Assistant Examiner* — Yaritza H Perez Bermudez
(74) *Attorney, Agent, or Firm* — M&B IP Analysts, LLC

(57) ABSTRACT

A system and method for the synchronization of a central controller wirelessly for determining values of electrical parameters. The method includes sampling an electrical signal via at least one self-powered power sensor (SPPS); estimating, via the at least one SPPS, a time-stamp based on the sampled electrical signal; estimating, via the at least one SPPS, at least a first electrical parameter; generating a preamble of a packet; generating a synchronization information for a synchronization field of the packet; transmitting the packet components wirelessly; determining a time offset value for the packet based on the time-stamp and the transmission time-stamp of the synchronization information; and transmitting the time offset value by appending the time offset value to the packet, wherein the time offset value is used for determining at least a second electrical parameter.

13 Claims, 7 Drawing Sheets

(56) References Cited

U.S. PATENT DOCUMENTS

| | | | |
|---|---|---|---|
| 5,006,846 A | 4/1991 | Granville et al. | |
| 5,892,430 A * | 4/1999 | Wiesman | G01R 1/30 340/538.16 |
| 5,995,911 A | 11/1999 | Hart | |
| 6,018,700 A | 1/2000 | Edel | |
| 6,160,697 A | 12/2000 | Edel | |
| 6,198,403 B1 | 3/2001 | Dorrough et al. | |
| 6,259,372 B1 | 7/2001 | Taranowski et al. | |
| 6,417,661 B1 | 7/2002 | Berkcan et al. | |
| 6,433,981 B1 | 8/2002 | Fletcher et al. | |
| 6,470,283 B1 | 10/2002 | Edel | |
| 6,727,684 B2 | 4/2004 | Hatanaka | |
| 6,756,776 B2 | 6/2004 | Perkinson et al. | |
| 6,798,209 B2 | 9/2004 | Lavoie et al. | |
| 6,825,650 B1 | 11/2004 | McCormack et al. | |
| 7,010,438 B2 | 3/2006 | Hancock et al. | |
| 7,058,524 B2 | 6/2006 | Hayes et al. | |
| 7,072,779 B2 | 7/2006 | Hancock et al. | |
| D534,120 S | 12/2006 | Ricci et al. | |
| 7,145,322 B2 | 12/2006 | Solveson et al. | |
| 7,242,157 B1 | 7/2007 | Edel | |
| 7,253,602 B2 | 8/2007 | Shvach et al. | |
| 7,282,944 B2 | 10/2007 | Gunn et al. | |
| 7,321,226 B2 | 1/2008 | Yakymyshyn et al. | |
| 7,436,641 B2 | 10/2008 | Holley | |
| 7,453,267 B2 | 11/2008 | Westbrock et al. | |
| 7,463,986 B2 | 12/2008 | Hayes | |
| 7,557,563 B2 | 7/2009 | Gunn et al. | |
| 7,561,035 B2 | 7/2009 | Sahashi et al. | |
| 7,876,086 B2 | 1/2011 | Jansen et al. | |
| 8,022,690 B2 | 9/2011 | Kagan | |
| 8,085,819 B2 * | 12/2011 | Kiran | H04L 1/0006 370/335 |
| 8,095,080 B2 | 1/2012 | Rofougaran | |
| 8,190,101 B2 | 5/2012 | Rofougaran | |
| 8,421,444 B2 | 4/2013 | Gunn | |
| 8,447,243 B2 | 5/2013 | Rofougaran | |
| 8,526,893 B2 | 9/2013 | Rofougaran | |
| 8,782,453 B2 | 7/2014 | Kim et al. | |
| 9,077,315 B2 * | 7/2015 | Bogdan | H03H 17/0251 |
| 9,134,348 B2 | 9/2015 | Shamir | |
| 9,429,974 B2 | 8/2016 | Forbes | |
| 9,439,218 B2 | 9/2016 | Kats et al. | |
| 9,853,498 B2 * | 12/2017 | Hansell | H02J 13/0017 |
| 2003/0014678 A1 * | 1/2003 | Ozcetin | G06F 1/14 713/400 |
| 2005/0206530 A1 * | 9/2005 | Cumming | G01D 4/006 340/870.02 |
| 2006/0119344 A1 | 6/2006 | Benke et al. | |
| 2006/0224335 A1 * | 10/2006 | Borleske | G01D 4/002 702/62 |
| 2006/0224336 A1 | 10/2006 | Petras et al. | |
| 2007/0059986 A1 | 3/2007 | Rockwell | |
| 2007/0136010 A1 | 6/2007 | Gunn et al. | |
| 2008/0077336 A1 * | 3/2008 | Fernandes | G01R 15/142 702/57 |
| 2008/0122642 A1 * | 5/2008 | Radtke | G01R 19/16547 340/660 |
| 2008/0266056 A1 | 10/2008 | Alomar | |
| 2008/0312851 A1 | 12/2008 | Kagan et al. | |
| 2009/0051557 A1 | 2/2009 | Beatty et al. | |
| 2009/0112496 A1 | 4/2009 | Suzuki | |
| 2009/0115403 A1 | 5/2009 | Bernklau | |
| 2009/0115509 A1 | 5/2009 | Minteer | |
| 2009/0167291 A1 * | 7/2009 | Richeson | G01D 4/004 324/107 |
| 2009/0167547 A1 | 7/2009 | Gilbert | |
| 2009/0289506 A1 * | 11/2009 | Harres | G08C 17/04 307/104 |
| 2010/0153036 A1 | 6/2010 | Elwarry et al. | |
| 2010/0264906 A1 * | 10/2010 | Shamir | G01R 15/186 324/127 |
| 2011/0082599 A1 | 4/2011 | Shinde et al. | |
| 2011/0128656 A1 | 6/2011 | Kohler | |
| 2011/0208450 A1 * | 8/2011 | Salka | H01H 9/167 702/62 |
| 2012/0062249 A1 * | 3/2012 | Shamir | G01R 15/186 324/679 |
| 2012/0065907 A1 | 3/2012 | Kozakai et al. | |
| 2012/0208479 A1 | 8/2012 | Pistor et al. | |
| 2014/0200843 A1 * | 7/2014 | Shamir | G01R 21/133 702/107 |
| 2014/0247892 A1 * | 9/2014 | Williams | H04B 3/54 375/257 |
| 2014/0340236 A1 | 11/2014 | Rhoads et al. | |
| 2015/0276829 A1 | 10/2015 | Shamir et al. | |
| 2015/0331024 A1 | 11/2015 | Bruel et al. | |
| 2015/0369848 A1 | 12/2015 | Shamir | |
| 2016/0231361 A1 | 8/2016 | Shamir et al. | |
| 2016/0353238 A1 * | 12/2016 | Gherardi | H04W 4/021 |
| 2016/0374043 A1 | 12/2016 | Wetterwald et al. | |
| 2017/0005533 A1 | 1/2017 | Zeine et al. | |
| 2017/0030952 A1 * | 2/2017 | Shamir | G01R 21/14 |
| 2018/0031617 A1 | 2/2018 | Rieken et al. | |
| 2018/0128859 A1 * | 5/2018 | Shamir | G01R 15/18 |
| 2018/0139021 A1 * | 5/2018 | Atungsiri | H04J 11/00 |
| 2018/0292447 A1 | 10/2018 | Piyasinghe et al. | |
| 2019/0033354 A1 * | 1/2019 | Shamir | G01R 21/133 |
| 2019/0037515 A1 * | 1/2019 | Shamir | G01R 19/02 |

FOREIGN PATENT DOCUMENTS

| | | |
|---|---|---|
| GB | 2543685 A | 4/2017 |
| WO | 1999043010 A2 | 8/1999 |
| WO | 2010068582 A1 | 6/2010 |

OTHER PUBLICATIONS

International Search Report and Written Opinion of International Searching Authority for PCT/US2018/030205, ISA/RU, Moscow, Russia, dated Aug. 9, 2018.

International Search Report and Written Opinion of the International Searching Authority for PCT/US2018/024835, ISA/RU, Moscow, Russia, dated Jul. 16, 2018.

"International Search Report and Written Opinion of the International Searching Authority dated Aug. 10, 2010", International Application No. PCT/IB2010/000846.

"International Search Report and Written Opinion of the International Searching Authority dated May 16, 2012, International Application No. PCT/IL2012/00013", (May 16, 2012).

"Notice of Allowance dated Jan. 14, 2014; United Kingdom Patent Application No. 1307220.2", (Jan. 14, 2014).

"Notice of Allowance dated Jan. 28, 2014; United Kingdom Patent Application No. 1316868.7", (Jan. 28, 2014).

"Notice of Allowance dated Jan. 7, 2014; United Kingdom Patent Application No. 1119518.7", (Jan. 7, 2014).

"Notice of Allowance dated Jun. 1, 2015; Chinese Patent Application No. 201080025086.3", (Jun. 1, 2015).

"Office Action dated Aug. 19, 2014; Chinese Patent Application No. 201080025086.3", (Aug. 19, 2014).

"Office Action dated Feb. 13, 2015; Chinese Patent Application No. 201080025086.3", (Feb. 13, 2015).

"Office Action dated Feb. 19, 2013; United Kingdom Patent Application No. 1119518.7", (Feb. 19, 2013).

"Office Action dated Feb. 24, 2014; U.S. Appl. No. 12/760,867", (Feb. 24, 2014).

"Office Action dated Jan. 23, 2013; U.S. Appl. No. 12/760,867", (Jan. 23, 2013).

"Office Action dated May 2, 2014; U.S. Appl. No. 12/760,867", (May 2, 2014).

"Office Action dated May 24, 2013; United Kingdom Patent Application No. 1119518.7", (Jul. 24, 2013).

"Office Action dated May 24, 2013; United Kingdom Patent Application No. 1307220.2", (May 24, 2013).

"Office Action dated Nov. 11, 2013; Chinese Patent Application No. 201080025086.3", (Nov. 11, 2013).

"Office Action dated Nov. 8, 2013; U.S. Appl. No. 12/760,867", (Nov. 8, 2013).

(56) References Cited

OTHER PUBLICATIONS

"Office Action dated Oct. 27, 2014; U.S. Appl. No. 12/760,867", (Oct. 27, 2014).
"Office Action dated Oct. 29, 2013; United Kingdom Patent Application No. 1119518.7", (Oct. 29, 2013).
"Office Action dated Oct. 29, 2013; United Kingdom Patent Application No. 1307220.2", (Oct. 29, 2013).
"Office Action dated Oct. 29, 2013; United Kingdom Patent Application No. 1316868.7", Oct. 29, 2013).
"Office Action dated Sep. 19, 2013; German Patent Application No. 112010001638.0", (Sep. 19, 2013).
"Office Action dated Sep. 20, 2012; U.S. Appl. No. 12/760,867", (Sep. 20, 2012).

* cited by examiner

TIMING SYNCHRONIZATION OF SELF-POWERED POWER SENSORS AND A CENTRAL CONTROLLER COLLECTING SAMPLES THEREFROM

CROSS-REFERENCE TO RELATED APPLICATIONS

This application claims the benefit of U.S. Provisional Application No. 62/537,324 filed on Jul. 26, 2017, the contents of which are hereby incorporated by reference.

TECHNICAL FIELD

The present disclosure relates generally to self-powered power sensors (SPPSs) and more specifically to accurately synchronizing SPPS for measuring power consumption when using wireless SPPSs.

BACKGROUND

The use of self-powered power sensors (SPPSs) placed at a plurality of locations within a facility's electrical grid allows for the measurement of power consumption throughout the grid. Typically, such SPPSs are positioned at points of interest of power consumption, such as at circuit breakers or at higher power consumption devices.

FIG. 1 is a block diagram of an exemplary SPPS 100 that includes a current transformer (CT) 103 having its primary winding accepting the primary current 102. It further includes an analog-to-digital converter (ADC or A/D) 105 that converts the analog signal into a series of digital samples under the control of a clock or timer 113 and a microcontroller (MC) 107. The samples gathered by the ADC 105 are processed by the MC 107 and then, using a transceiver 109, the processed information is transmitted using an antenna 116. An oscillator 110 oscillates at a desired frequency and feeds to the clock or timer 113.

FIG. 2 is a block diagram of a modified SPPS 200 that includes the same basic elements as described for the SPPS 100 depicted in FIG. 1. The modified SPPS 200 further includes a low pass filter (LPF) 202 coupled to the CT 103 and ADC 105. In one embodiment, LPF 202 is an analog filter. The input current 201 may be derived from the CT 103. The LPF 202 may be implemented in many different ways including, but not limited to, passive or active filters, matched filters, or harmonic filters. According to one embodiment, as shown in FIG. 2, the filtered signal 203 is fed to the ADC 105. The MC 107 can select what signal shall be sampled (i.e., an input signal 104 or a filtered signal 203). In other embodiments, the ADC 105 includes two channels, where both signals can be sampled simultaneously. According to one embodiment, the LPF 202 can be activated only when sampling the fundamental signal 203, thus saving power consumption.

FIG. 3 is a block diagram of yet another modified SPPS 300 that includes the same basic elements as described for the modified SPPS 200 depicted in FIG. 2. The SPPS 300 further includes a zero-crossing (or zero-cross) detector circuit 301 connected to the LPF 202 and the clock or timer 113. The filtered signal 203 is fed to a zero-crossing detection circuit 301 which generates a signal 302 relative to the zero-crossing time of the filtered signal 203. Further, according to this embodiment, the generated signal 302 may be time-stamped by, for example, the clock or timer 113. According to one embodiment, the zero-crossing detection circuit 301 may include a comparator, preferably with a small aperture to avoid significant errors in the zero-crossing detection.

Regardless of these and other embodiments for determining power consumption, the currently available SPPSs allow for only limited accuracy of measurement. That is, to accurately measure the power consumption of a load it is necessary to measure the power factor. Such a factor contains information of the phase difference between the voltage and the load current, as well as the distortion of the load current and voltage from a pure sinusoidal wave. In previous power measuring systems, voltage and current are simultaneously measured by the same physical device and therefore the relationship between the two signals is easy to calculate and measure. However, when there is a wireless connection between the current and voltage sampling, accurate measurement requires additional innovation to overcome the deficiencies of wireless SPPSs for measuring power consumption accurately.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" may be used herein to refer to a single embodiment or multiple embodiments of the disclosure.

Some embodiments disclosed herein include a method for synchronization of a central controller wirelessly for determining values of electrical parameters, including sampling an electrical signal via at least one self-powered power sensor (SPPS); estimating, via the at least one SPPS, a time-stamp based on the sampled electrical signal; estimating, via the at least one SPPS, at least a first electrical parameter; generating a preamble of a packet; generating a synchronization information for a synchronization field of the packet; transmitting the packet components wirelessly; determining a time offset value for the packet based on the time-stamp and the transmission time-stamp of the synchronization information; and transmitting the time offset value by appending the time offset value to the packet, wherein the time offset value is used for determining at least a second electrical parameter.

Some embodiments disclosed herein also include a non-transitory computer readable medium having stored thereon instructions for causing a processing circuitry to perform a process, the process including sampling an electrical signal via at least one self-powered power sensor (SPPS); estimating, via the at least one SPPS, a time-stamp based on the sampled electrical signal; estimating, via the at least one SPPS, at least a first electrical parameter; generating a preamble of a packet; generating a synchronization information for a synchronization field of the packet; transmitting the packet components wirelessly; determining a time offset value for the packet based on the time-stamp and the transmission time-stamp of the synchronization information; and transmitting the time offset value by appending the time offset value to the packet, wherein the time offset value is used for determining at least a second electrical parameter.

Some embodiments disclosed herein also include a self-powered power sensor (SPPS) adapted for the purpose of performing value corrections to calculated electrical parameters, the SPPS including a current transformer, where a primary winding of the current transformer is a powerline; an analog-to-digital converter (ADC) connected to the secondary winding of the current transformer; a wireless transmitter; a processing unit connected to the ADC and configured to: sample an electrical signal off of the secondary winding of the current transformer; estimate a time-stamp based on the sampled electrical signal; estimate at least a first electrical parameter; generate a preamble of a packet; generate a synchronization information for the synchronization field of the packet; cause the transmitter to transmit the packet components comprising the preamble, the synchronization field and the at least a first electrical parameter to a central controller; determine a time offset value for the packet, the time offset calculated from the time-stamp and the transmission time-stamp of the synchronization information; and cause the transmitter to transmit the time offset value by appending it to the packet, wherein the time offset value is used for the purpose of calculating of at least second electrical parameter; and a clock connected to an oscillator, wherein the clock is connected to the ADC, the processing unit and the transmitter.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
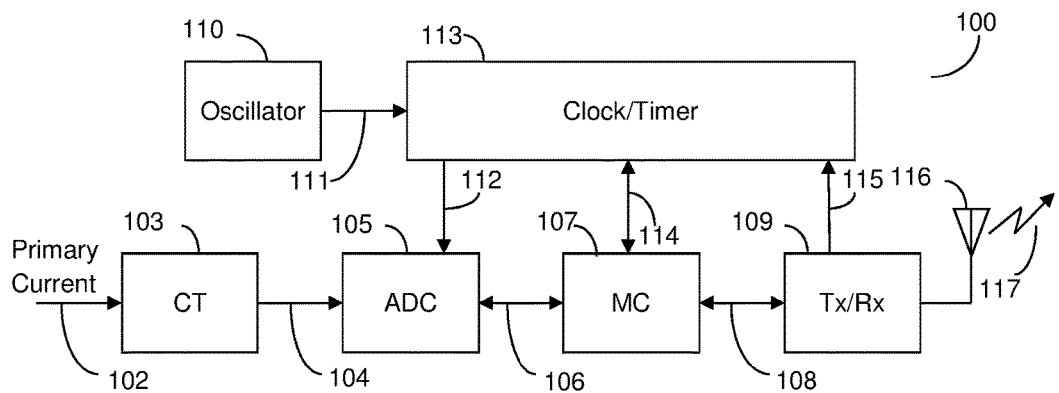
FIG. 1 is a first exemplary prior art embodiment of a self-powered power sensor (SPPS) (prior art).

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Some example disclosed embodiments include a method and system for a self-powered power sensor (SPPS) to sample at least a current signal. Current signal information is transmitted wirelessly to a central controller using a packet of data containing a preamble, synchronization information, current signal information and transmission offset time information. Transmission begins prior to the completion of the creation of the packet so as to include a transmission offset time that is used by the central controller for the estimation of electrical parameters. The central controller may sample the voltage signal and determine, based on the packet received and the current signal information, a phase shift of the current versus the voltage as well as a power factor. The power factor may be corrected by a current distortion factor. The current signal may be sampled as a reference to allow the computation of the zero-crossing point, the maximum point, or the minimum point of the current signal.

FIG. 1 depicts a first example diagram of an SPPS 100 according to a first embodiment. The SPPS 100 includes a current transformer (CT) 103 having its primary winding accepting the primary current 102. It further includes an analog-to-digital converter (ADC or A/D) 105 that converts the analog signal 104 into a series of digital samples 106 under the control of a clock or timer 113 and a microcontroller (MC) 107. The samples 106 gathered by the ADC 105 are processed by the MC 107 and then, using the transceiver 109, processed information is transmitted using antenna 116. An oscillator 110 oscillates at a desired frequency and feeds to the clock or timer 113. U.S. Pat. No. 9,134,348 entitled "Distributed Electricity Metering System" and which is assigned to common assignee, describes in further details such an exemplary SPPS. The power sensed in that embodiment is used for three purposes: to provide the power needed for the operation of the SPPS 100; to detect the actual power consumption of the load connected to the power line 102; and to detect and time stamp the phase of the current signal.

The following description is focused on the detection of the actual power consumption of the load connected to the power line 102 and to the detection and time stamping of the phase of the current signal. Specifically, to accurately measure the power consumption of the load, it is necessary to measure the power factor, which is a factor that contains information on the phase difference between the voltage and the load current, as well as the distortion of the load current and voltage from a pure sinusoidal wave. In standard power measuring systems, voltage and current are simultaneously measured by the same physical device and therefore the relation between the two signals is easy to determine and measure.

According to one embodiment, the input current signal (i.e., the signal sampled from the power line) 102 is transformed by the current transformer 103 to an analog signal 104 which can be sampled by an ADC 105 connected to a microcontroller 107. The analog signal 104 is a periodic signal representing the load current with a frequency equivalent to the grid frequency. Such a signal typically is a sinusoidal or close to sinusoidal waveform, but may also be highly distorted and include high-order harmonics. Typically, the CT analog signal is a current signal connected to a small resistor (e.g., a current sense resistor—not shown in the figure). The voltage generated across the sense resistor is then sampled by the ADC 105.

The ADC 105 can sample the input signal 104 with a sampling clock 112 which can be provided by the clock or timer 113. For example, this clock sampling 112 can be 3,200 Hz when sampling 50 Hz signals. In one embodiment, the clock or timer 113 is driven from a clock 111 provided by an oscillator 110. The samples 106 can be stored in the MC 107, for example, in a memory therein or a memory connected thereto (not shown), for further processing. In one embodiment, the MC 107 is in standby mode when triggered 114 by the clock or timer 113 to exit standby mode and start processing. This trigger may be an interrupt signal provided by the clock or timer 113.

When the MC 107 wakes-up, the MC 107 is configured to program the clock or timer 113 and the ADC 105 to start sampling the signal 104. The number of samples may include at least a half cycle of the signal (e.g., 32 samples when sampling a 50 Hz signal with a 3,200 Hz sampling clock). Once the samples 106 have been stored, the MC 107 is configured to process the samples to roughly estimate the start of a cycle (Ts) of the input signal 104.

In an embodiment, once the start of the cycle (Ts) has been estimated, the MC 107 can program the clock or timer 113 to force the ADC 105 to start a new burst of samples (e.g., 32 samples) at Ts. Since the start of the sampling is triggered by the clock or timer function 113, and not by a software command from the MC 107, the time-stamp of all the samples can be accurately recorded. According to one embodiment, the MC 107 may estimate the time of the zero-crossing point ($T_1$) of the sampled signal 106. Accurately estimating the time of the zero-crossing point enables accurate measurement of the load power factor as will further described below. This may be the 0° or 180° zero-crossing of the periodic load signal. Other embodiments disclosed herein may include estimating the peak (positive or negative) of the signal; however, due to the low derivative of a sinusoidal signal around the peak, such estimate may not be particularly accurate.

In one embodiment, the zero-crossing point ($T_1$) estimation may be done by linear interpolation or extrapolation, or may include more sophisticated and accurate methods such as non-linear regression or similar methods. For example, in a linear approximation, linear regression can be applied on the last two samples prior to the zero-crossing, represented by samples Sa and Sb and times Ta and Tb accordingly, to find the constants a and b of a linear equation S=a*T+b representing the part of the signal that is close to the zero-crossing. Applying S=0 will yield $T_1$ which is the zero-crossing point. In another embodiment, $T_1$ can be taken simply as the time of the first sample where the sample value changes sign between positive and negative or vice versa, or the average of the times of the two samples in which the analog signal changes sign, although the latter two may be less accurate if the sampling rate is not sufficiently high. In certain embodiments, estimating the zero-crossing point with an accuracy of ±0.5° may be sufficient for estimating the power factor, while other embodiments may require different levels of accuracy.

Without interrupting the clock or timer operation 113 (to avoid losing synchronization to the time-stamped samples and estimated zero-crossing time $T_1$), the SPPS 100 may start transmitting a wireless message 117 to a central controller (not shown). For that purpose, a radio frequency (RF) transceiver 109 is coupled to the MC 107 and to an antenna 116 to provide one or two-way communication with a central controller (e.g., a bridge, discussed in more detail herein below with respect of FIGS. 5 and 6).

In one embodiment, the RF transceiver 109 supports transmission only, i.e., uplink communication. Moreover, it should be noted that the method is designed to enable accurate power factor measurement using only an uplink communication. This advantage avoids activating the SPPS in receive mode in order to save energy with a self-powered device. However, the RF transceiver 109 may include a receiver portion to support features such as, but not limited to, sensing for a carrier signal, clock synchronization, acknowledgement, firmware download, configuration download, and the like. Typically, this should be an unlicensed industrial scientific medical (ISM) band transceiver, operative, for example and without limitation, at 2.4 GHz or sub GHz bands.

In one embodiment, some form of spread-spectrum modulation technique may be used, for example and without limitation, direct sequence spread spectrum (DSSS), to enable better coexistence with other systems working in the same environment. The communication rate should be high enough to enable coexistence of a couple of hundred SPPSs in the same electrical closet. The power consumption of the RF transceiver 109 should be low enough to adhere to energy harvesting limitations which may be used by an SPPS. Yet another requirement of the RF transceiver 109 is to support a communication range sufficient to operate in an electrical closet, e.g., 3-4 meters metallic reach environment.

In another embodiment, the range may reach up to a few tens of meters in an indoor environment. This enables the placing of SPPSs on individual devices, e.g., on machines in a production line of a factory, and a minimum number of bridge units in a given area. The RF transceiver 109 preferably uses a standard physical layer (PHY) supporting, for example, IEEE 802.15.4, or communication protocol, for example, ZigBee. Use of such standards enables easy integration with existing systems that already include wireless hardware, e.g., smart meters.

Upon determination that a transmission is to take place, the MC 107 prepares a message 108 to be transmitted. The message 108 is typically a single packet of data that may contain various types of information and includes the SPPS's unique identification (UID) which enables a central controller to positively associate the current data received with previous data handled by the central controller with respect of the SPPS 100. The transmitted message 108 may include different fields of information. One of those message fields may be a SYNC field which is typically transmitted following a message preamble. The SYNC field allows an accurate time-stamping 115 by the clock or timer 113 of the message transmission time ($T_2$).

In an embodiment, the message 108 packet may include, without limitations, various SPPS status information, hardware version, software version, alerts such as overload, average current, SPPS temperature, time-stamped samples, input signal characteristics, power off indication, e.g., upon identification that the load was turned off, and other system parameters. Such parameters may be saved until such time of transmission in the MC 107 memory (not shown). A cyclic redundancy code (CRC) calculation, forward error correction (FEC), or data redundancy may be further added to a packet for data validation at the receiver side.

As previously described, the input signal 104 may be a superposition of the fundamental frequency (for example 50 Hz) and higher order harmonics or noise. This is typical when sampling power lines connected to non-linear loads, such as, for example, on/off operations. In such cases, the current signal is distorted and hence the timing of the zero-crossing does not necessarily represent the phase shift from the voltage. Moreover, in highly distorted loads with a large content of high order harmonics one may encounter several zero-crossings within a single cycle. The zero-crossing point ($T_1$) relevant for the power factor determination (as explained below) must be one of the fundamental components of the frequency of the signal (for example 50 Hz) and not of the distorted signal that is a superposition of the fundamental frequency and higher order harmonics. In such an embodiment, estimating the zero-crossing point ($T_1$) of the sampled signal 106 may require a previous filtering of the input or sampled signal to allow estimating the zero-crossing point on the fundamental component of the input signal.

According to one embodiment, filtering the input signal 104 may be performed by a digital filter implemented by the MC 107. In such an embodiment, the MC 107 may use the signal samples to generate a new set of samples of a filtered signal. For example, a third-order low pass filter with an attenuation of 20 dB of the third harmonic (i.e., 150 Hz harmonic for a 50 Hz input signal) may suffice for typical third harmonic distortions. Other embodiments may include different types of digital filters with a higher order.

The settling time of the digital filter may require using more than half a cycle. It may be necessary in certain embodiments to store 5 or 10 cycles so as to let the digital filter settle and provide an accurate output. In addition, as previously described, 32 samples per half cycle may not be sufficient for the same reason. In certain embodiments, it may be necessary to sample 80-120 per half cycle, or even more.

According to one embodiment, the MC 107 may also estimate the root mean square (RMS) value of the input signal 102 and the RMS value of the filtered signal (i.e., the fundamental component). Those values may be calculated using the respective signal samples and the filtered samples. This allows for a more accurately computation of the power factor according to the following approximation:

$$PF = \frac{V_f[\text{RMS}]}{V_s[\text{RMS}]} * \frac{I_f[\text{RMS}]}{I_s[\text{RMS}]} * \cos(\phi)$$

where, $I_s$ [RMS] is the RMS value of the input (non-filtered) signal; $I_f$ [RMS] is the RMS value of the fundamental component of the input signal; $V_s$ [RMS] is the RMS value of the voltage; $V_f$ [RMS] is the RMS value of the fundamental component of the voltage; cos ($\phi$) is the displacement power factor, or the power factor of the fundamental signal; and, PF is the true power factor.

It should be noted that when using a filter to attenuate the harmonics and the noise, the phase delay introduced by the filter itself should be factored. This is important to allow estimating the true zero-crossing time. According to one embodiment, $V_s$ and $V_f$ may be estimated by a central controller. However, in another embodiment, as voltage is kept relatively constant and un-distorted by the network provider, $V_s$ and $V_f$ may be ignored and $V_f/V_s$ can be assumed to be equal to 1.

In one embodiment, when conditions to transmit are met, the MC 107 can implement a carrier sense multiple access (CSMA) protocol mechanism for the purpose of collision avoidance. The following steps may be taken: first, the receiver of the RF transceiver 109 is switched on. Second, the receiver senses whether there are currently other transmissions. This is particularly important in the environment in which the SPPS operates, which may be an environment rich with SPPSs. Third, upon determination that the air is free, the receiver is disabled and the transmitter of the RF transceiver 109 is enabled for transmission to send the information message 108; otherwise, the receiver is disabled and the MC 107 selects a random time interval, after which the MC 107 attempts to start a new transmission, until the desired transmission is completed.

In one embodiment, the information messages are short enough and the intervals between transmissions are long enough such that collisions are highly unlikely. In such an embodiment, the transmission of the transmitted message 117 may take place without pre-sensing of the air, thereby conserving energy. During the message 108 transmission, as soon as the SYNC field is transmitted, the SYNC transmission is time-stamped 115 by the clock or timer 113. The time-stamp of the SYNC field transmission is denoted as $T_2$. Since the clock or timer 113 is continuously running from the time the time-stamped samples have been collected until a message transmission is performed, the time-stamp $T_2$ denoting the SYNC field transmission is fully synchronized with the estimated zero-crossing $T_1$. Thus, during the message 108 transmission the MC 107 determines the time difference between the SYNC field transmission $T_2$ and the estimated zero-crossing $T_1$ of the sampled signal 106. We denote this time as Delta T:

$$\text{Delta } T = T_2 - T_1$$

In some configuration, the computation of the Delta T value includes handling the wraparound of the timer 113 between $T_1$ and $T_2$. According to one embodiment, the MC 107 is configured to estimate the value Delta T and insert this value in the message packet being transmitted 117. In addition, it should be apparent that the accuracy of Delta T is affected by the accuracy of the time stamps $T_1$ and $T_2$. For example, using a timer clock resolution of <1 μsec should provide highly accurate time stamps for an accurate power factor determination in accordance with the disclosed embodiments (for a 50 Hz signal, 1 degree of phase is around 55.56 μsec). It is important to note that Delta T is computed on the fly, that is, while the message 108 is being transmitted. Therefore, Delta T links the estimated zero-crossing time $T_1$ to the actual time of the message transmission $T_2$. This process is further explained in relation to FIG. 4 below.

In one embodiment, the transmitted message may also include information to let the central controller receiving the message fully compute the zero-crossing of the primary input current signal (i.e., the current signal through the power line, which is the primary winding of the current transformer 103). This information may include the time delay of the CT 103 ($T_{CTD}$) which is the time delay of the SPPS's 100 current transformer 103 (i.e., the time difference between the primary current 102 and the signal 104 fed to the ADC 105). It should be recognized that a CT-based sensor may also cause a phase shift that may impact the accuracy of the measurements. In some cases, this phase delay may be significant and should not be ignored if an accurate power factor computation is desired. The CT 103 phase delay is not constant and is affected by several factors, including, but not limited to, input current 102 amplitude (RMS); type of current transformer; current transformer temperature; input signal 102 frequency; and, the air gap of the current transformer (in the case of a split core CT). Therefore, in one embodiment, a phase calibration factor value may be transmitted in the message sent from the SPPS 100 to the central controller. Such a calibration factor may be embedded as part of the code or configuration parameters of the MC 107 during manufacturing, or, if the SPPS 100 is susceptible to change, for example over time or a temperature range, by periodically performing a self-determination of the calibration factor necessary due to the current characteristics of the SPPS 100. In one embodiment, the calibration factor can be a linear or a higher degree function of the input current, expressed in a formula or lookup table. This is specifically relevant for nonlinear CT's. In another embodiment, the phase calibration factor may be known to the central controller. Regardless of the way such a calibration factor is provided, the factor may be used for the purpose of correcting the power factor or signal timing on a per SPPS 100 basis. Of course, it should be understood that a single calibration factor for all of the SPPS 100 is also possible without departing from the scope of the disclosure. According to one embodiment, the estimated CT 103 delay ($T_{CTD}$) is then transmitted to a central controller in the transmitted message.

the time delay of the CT 103 may also include the delay of filter ($T_{FD}$) which is the time delay of the filter (e.g., a low pass filter) used to attenuate the input signal distortion caused by harmonics and noise. $T_{FD}$ refers to the phase delay of the fundamental component of the input signal. According to one embodiment, the $T_{FD}$ is computed or measured and transmitted to a central controller as part of the transmitted message. When digital filters are used, the delay of this filter is a function of the filter type, but it does not change among different SPPS units or the amplitude of the input current.

This information may also include the delay of transmitter ($T_{TD}$), which is the time delay introduced by the transmitter before the signal is actually transmitted through the antenna 116. This time delay is the difference between the time stamp ($T_2$) of the SYNC field and the time when the SYNC field has been transmitted through the antenna 116. This delay depends on the transmitter implementation and the logic used to generate a pulse at the end of the SYNC field transmission. In one embodiment, this delay may be in the order of 10-20 μsec and cannot be ignored. However, often it is constant and can be accurately measured. According to one embodiment, the delay of the SPPS transmitter ($T_{TD}$) is determined or measured and transmitted to a central controller in the transmitted message. In different embodiments, all of the above delay factors can be summed together ($T_{CTD}+T_{TD}+T_{FD}$) and transmitted together as a single delay factor, transmitted separately, stored in any part of the receiving system or any combination of the above.

Figure 2:
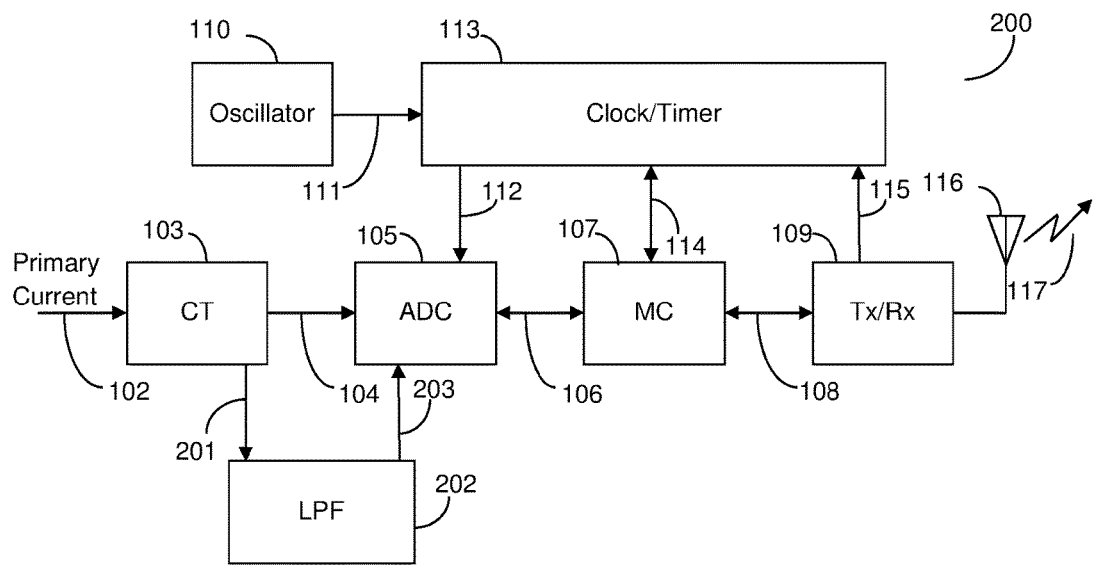
FIG. 2 is a second exemplary prior art embodiment of an SPPS (prior art).

FIG. 2 shows an example diagram of a self-powered power sensor (SPPS) 200 according to another embodiment. As previously noted, the SPPS 200 includes the same basic elements as described for SPPS 100 depicted in FIG. 1. The SPPS 200 further includes a low pass filter 202 connected to the current transformer 103 and ADC 105. In one embodiment, low pass filter 202 is an analog filter. The input 201 may be derived from the current transformer 103. The analog filter may be implemented in many different ways including passive or active filters, matched filters, harmonic filters, and the like.

According to the embodiment shown in FIG. 2, the filtered signal 203 is fed to the ADC 105. Thus, the MC 107 can select which signal to be sampled (i.e., input signal 104 or filtered signal 203). In other embodiments, the ADC 105 includes two channels and both signals can be sampled simultaneously. According to one embodiment, the low pass filter 202 can be activated only when sampling the fundamental signal 203 is required, thus saving power consumption.

Figure 3:
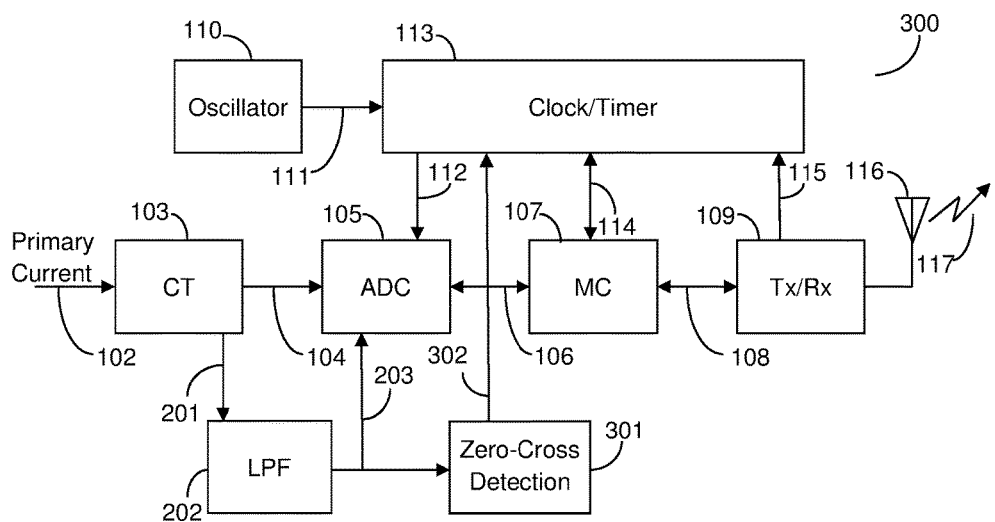
FIG. 3 is a third exemplary prior art embodiment of an SPPS (prior art).

FIG. 3 depicts an example diagram of a self-powered power sensor (SPPS) 300 according to yet another embodiment. As previously noted, the SPPS 300 includes the same basic elements as described for SPPS 200 depicted in FIG. 2, where SPPS 300 further includes a zero-crossing detector circuit 301 coupled to the low pass filter 202 and the clock or timer 113. In one embodiment, the low pass filter 202 is an analog filter. The input 201 may be derived from the current transformer 103. The analog filter may be implemented in many different ways, including passive or active filters, matched filters, harmonic filters, and the like.

According to the embodiment shown in FIG. 3, the filtered signal 203 is fed to a zero-crossing detection circuit 301 which generates a signal 302 relative to the zero-crossing time of the filtered signal 203. Further, according to this embodiment, the generated signal 302 may be time-stamped by the clock or timer 113. Thus, the MC 107 can use the time stamp of zero-crossing ($T_1$) to determine Delta T as previously described. This is instead of estimating the zero-crossing of the signal using time-stamped samples as described in FIGS. 1 and 2. According to one embodiment, the zero-crossing detection circuit 301 may include a comparator, preferably with a small aperture to avoid significant errors in the zero-crossing detection.

Figure 4:
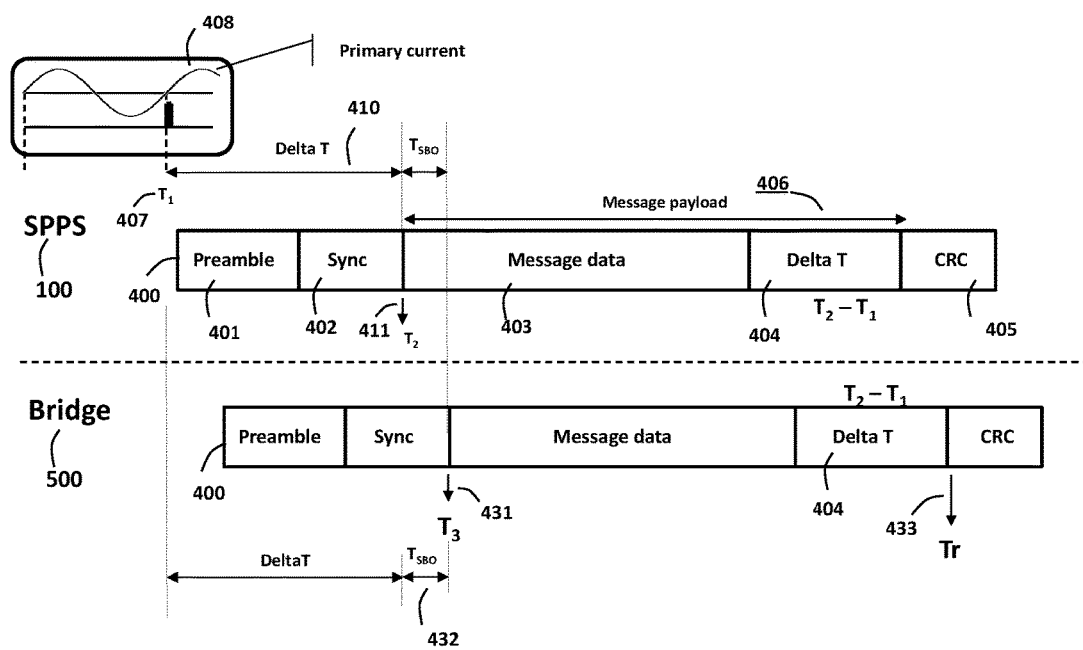
FIG. 4 is a message timing diagram and message structure transferred between an SPPS and central controller.

FIG. 4 shows a block diagram of a message timing and message structure for a message transferred between an SPPS, e.g. SPPS 100, and a central controller, e.g., central controller (or bridge) 500. According to one embodiment, the MC 107 in the SPPS 100 has the zero-crossing time stamp $T_1$ 407 of the input signal 408 or of the fundamental component of the input signal 408 if a low pass filter is implemented according to the embodiments described above. The zero-crossing time $T_1$ 407 may be estimated within the MC 107 from time-stamped samples according to the various methods described herein above or from another dedicated circuit. In another embodiment, the comparator used to implement a zero-crossing detector may be a function of the MC 107 itself or implemented by the MC 107. Without interrupting the time counting of the clock or timer 113, the MC 107 in the SPPS 100 may start transmitting a wireless message 400 to a central controller (e.g., bridge) 500.

According to one embodiment, the transmitted message 400 includes a preamble 401, typically used by the receiver to detect the incoming signal and if necessary to align some of its parameters (e.g., gain, receive clock frequency and phase, and the like). Following the preamble 401, a SYNC field 402 may be transmitted. Typically, the SYNC field 402 is used to align the receiver to the frame itself (i.e., to the start of the message payload 406). The SYNC field 402 can be represented by a binary series that has good autocorrelation properties in order to allow accurate frame synchronization of the receiver even in the presence of bit errors caused by a wireless link.

According to one embodiment, the receiver may discard the received message 400 if more than a certain amount of errors is detected (e.g., in a case in which the SYNC field 402 is 16 bits long, one can discard the received message if 2 out of 16 bits are wrong).

According to yet one embodiment, the transmission of the SYNC field 402 is time-stamped by the SPPS, denoted as $T_2$ 411. Further in accordance with this embodiment, time stamping of the SYNC field 402 transmission may be done by the transmitter logic itself (not shown) or by adding an external logic (not shown). For example, some System-in-Package devices may have this function built-in, e.g., in the transmitter or receiver logic. The transmitted message payload 406 may include message data 403 including SPPS identification, status of the SPPS, RMS values of the input current and filtered current signals, time-stamped samples, and any other information required by the system.

During the transmission of the message data 403, which, depending on the implementation and selected bit rate of the transmitter, may take a few hundreds of μsec (for example, a typical 100 bit message and a typical 250 Kbps transmission rate may take 400 μsec), the MC 107 determines Delta T 410 based on the estimated or time-stamped zero-crossing $T_1$ 407 and the time stamped SYNC field transmission $T_2$ 411. Delta T may or may not take into account the various correction factors described above such as, but not limited to, the filter delay, the CT delay and the transmitter delay. Note that Delta T 410 is determined with the accuracy of the clock provided by the master clock 110. Before the end of transmission of the message data 403 field, the MC 107 inserts the Delta T value 410 in the data buffer being transmitted. Once the message data field 403 is transmitted, the message transmission continues with the transmission of the data field 404 which includes the Delta T value 404.

In one embodiment, additional auxiliary bits may be added to the message data 403 prior to the Delta T value in order to allow sufficient time for the MC to determine delta T and insert it to the message on the fly. The message 400 transmission is completed by transmitting a CRC field 405 which is used by the receiver to detect errors in the message payload 406 or CRC 405.

The transmitted message 400 may be received by a central controller 500 (e.g., a bridge) located at a wireless communication distance from SPPS 100. According to one embodiment, the communication distance may vary between few to tens of meters. In such an embodiment, the propagation delay caused by the wireless link $T_{SBD}$ 432 is typically less than 0.2 μsec, which may be determined to be insignificant with respect to the phase delay accuracy required for the power factor computation. It should be appreciated that in some cases the propagation delay can also be accounted for as an additional correction factor to the ones mentioned herein and as will be shown further on.

When the central controller 500 (e.g., a bridge) receives the message 400, the controller 500 is configured to time stamp the reception of the SYNC field 402, denoted as $T_3$ 431 in FIG. 4. Following the SYNC field 402 reception by the central controller 500, the message data 403 and Delta T 404 fields are received. Assuming the message was received without errors (this is checked with the CRC 405), the central controller 500 has now the $T_3$ time stamp and the value of Delta T 404 retrieved from the received message at Tr 433. According to one embodiment, the central controller 500 can now determine the time stamp of the zero-crossing of the primary current signal 102 in the SPPS 100, in accordance with the central controller 500 time base. The computation is as follows:

$$T_{Pzc}=T_3+T_{cycle}-T_{CTD}-T_{FD}-(\text{Delta } T)-T_{TD}-T_{RD}-T_{SBD}$$

where, $T_{PZC}$ is the Zero-crossing time stamp of the primary input signal 102 in the SPPS 100. The time stamp is according to the central controller 500 (e.g. bridge) time base (timer); $T_3$ is the time stamp of the received SYNC field 402 at the central controller 500; $T_{cycle}$ is the cycle time of the input signal (e.g., 20 msec for a 50 Hz signal); $T_{CTD}$ is the time delay of the current transformer; $T_{FD}$ is the time delay of the SPPS filter (if used); Delta T is the value of $T_2$-$T_1$ as determined by the SPPS 100; $T_{TD}$ is the time delay of the SPPS transmitter; $T_{RD}$ is the time delay of the central controller receiver (similar to $T_{TD}$); and $T_{SBD}$ is the propagation time of the wireless message. Ignoring $T_{SBD}$ 432, which may be insignificant, the central controller 500 (e.g. bridge) can compute an accurate time stamp of the primary current signal zero-crossing at the SPPS 100 in its own time base.

It should be noted that wherever technically appropriate, SPPS 200 or SPPS 300 may replace the SPPS 100 described herein, and the use of SPPS 100 is for convenience of description and not intended to limit the scope of the disclosure.

Since the SPPS 100 and central controller 500 (e.g., bridge) have different clocks which are also unsynchronized, it is expected that time measurements in both units will not be identical. For example, in accordance of one embodiment, a 200 ppm clock drift between the SPPS 100 and the central controller 500 may be assumed. Furthermore, and as an example, if the value of Delta T is 15 msec, a typical 200 ppm drift generates an error of 3 μsec in the estimation of $T_1$ by the central controller 500. In other words, if the central controller 500 generated a pulse at time $T_{szc}$ it would have an offset of ~3-4 μsec to a pulse generated by the SPPS at $T_1$. This error caused by the clock drift generates an error in the zero-crossing estimation of around 0.05° for a 50 Hz signal. It may be determined that this error is acceptable and therefore the clock drift is negligible and does not need to be taken into account in a typical embodiment. Nevertheless, it is possible to reduce this error by using one or more of the following methods: reduce the clock drift by selecting more accurate oscillators 110 in the SPPS 100 and central controller 500; measure and calibrate the SPPS oscillator 110 during manufacturing and transfer this information to the central controller 500; and, measure by the central controller 500 the clock drift by estimating the difference in the RF carriers (typically generated from the same oscillator).

The present disclosure therefore enables a highly accurate time stamping by the central controller 500 (e.g. bridge) of the zero-crossing of a signal in the SPPS 100. This accuracy is achieved without a complicate synchronization mechanism between the SPPS and the central controller 500 and contemplating a case where the central controller 500 (e.g. bridge) has to handle hundreds of SPPS 100 units periodically transmitting the zero-crossing information as described. The time of the zero-crossing of the current input signal in the central controller 500 is necessary to determine the time difference to the voltage signal zero-crossing and then determine cos(φ).

Figure 5:
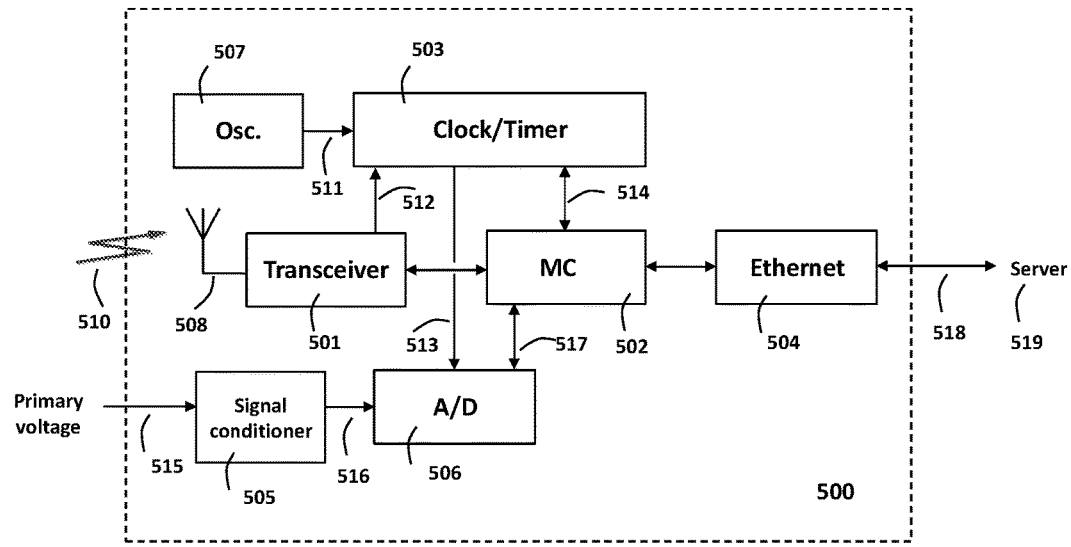
FIG. 5 is a block diagram of a central controller according to an embodiment.

FIG. 5 is a block diagram of an exemplary central controller 500 according to a fourth embodiment. The central controller 500 includes an analog section that is coupled to a microcontroller 502. The analog section includes a signal conditioner 505 to adapt the voltage signal from the power line 515, to a signal suitable to be sampled by an analog-to-digital converter (ADC) 506. The signal conditioner 505 may also include a protection circuit (not shown) to protect the bridge from disturbances in the voltage line. According to one embodiment, the primary voltage signal 515 is adapted by the signal conditioner 505 to a conditioned signal 516. The ADC 506 can sample the conditioned signal 516 with a sampling clock 513, which can be provided by a clock or timer 503. For example, this sampling clock 513 can be 3,200 Hz when sampling 50 Hz signals. In one embodiment, the clock or timer 503 is driven from a clock 511 provided by an oscillator 507. The samples 517 can be stored in the MC 502 of the central controller 500 or memory attached thereto (not shown) for further processing. In one embodiment, MC 502 is configured to periodically program and activate the clock or timer 503 to trigger and provide the clock 513 for the sampling of the conditioned signal 516 by the analog-to-digital converter 506.

The number of samples may include a full cycle of the signal 516 (e.g. 64 samples when sampling a 50 Hz signal with a 3,200 Hz sampling clock). Once the samples 517 have been stored in the MC 502 or the attached memory (not shown), the MC 502 can process the samples to accurately determine the zero-crossing of the conditioned voltage signal 516. Since the start of the sampling is triggered by the clock or timer function 513, and not by a software command from the MC 502, the time-stamp of all the samples can be accurately recorded.

According to one embodiment, the MC 502 may estimate the time of the zero-crossing point ($T_4$) of the sampled signal 516. This may be the 0° or 180° zero-crossing. Other embodiments disclosed herein may include estimating the peak (positive or negative) of the signal. However, due to the low derivative of sinusoidal signals around the peak such an estimate may be less accurate. In one embodiment, the zero-crossing point ($T_4$) estimation may be done by linear interpolation or extrapolation, or may include more sophisticated and accurate methods like non-linear regression or similar methods. The same methods as described above for the zero-crossing estimation for the current samples may apply here as well. In certain embodiments, estimating the zero-crossing point with an accuracy of ±0.5° may be sufficient for estimating the power factor while other embodiments may require different levels of accuracy. Without interrupting the clock or timer operation 503 (i.e., to avoid losing synchronization to the time-stamped samples and estimated zero-crossing time $T_4$), the bridge 500 may start receiving a wireless message 510 from an SPPS unit. For that purpose, a RF transceiver 501 is connected to the MC 502 and to an antenna 508 to provide one or two-way communication with an SPPS unit.

In one embodiment, the RF transceiver 501 supports reception only, i.e., uplink communication. Moreover, it shall be pointed out that the method described under this disclosure is designed to enable accurate power factor measurement using only an uplink communication. This advantage avoids activating the SPPS in receive mode in order to save energy with a self-powered device. However, the RF transceiver 501 may include a transmitter portion to support features such as, and without limitation, clock synchronization with an SPPS, acknowledgement, firmware download, and configuration download. Typically, this should be an unlicensed industrial scientific medical (ISM) band transceiver, operative, for example and without limitation, at 2.4 GHz or Sub GHz frequencies.

In one embodiment some form of spread-spectrum modulation technique may be used, for example and without limitation, direct sequence spread spectrum (DSSS), to enable better coexistence with other systems working in the same environment. The communication rate should be high enough to enable coexistence of a couple of hundred SPPSs in the same electrical closet. The power consumption of the RF transceiver 501 should be low enough to adhere with energy harvesting limitations which may be used by an SPPS. Yet another requirement of the RF transceiver 501 is to support a communication range sufficient to operate in an electrical closet, e.g., 3-4 meters metallic reach environment. In another embodiment the range may reach up to a few tens of meters in an indoor environment. This enables the placing of SPPSs on individual devices, e.g., on machines in a production line of a factory, and a minimum number of bridge units in the area. The RF transceiver 501 preferably uses a standard PHY layer supporting, for example and without limitations, IEEE 802.15.4, and/or communication protocol, for example and without limitation, ZigBee. Use of such standards enables easy integration with existing systems that already include wireless hardware, for example and without limitations, smart meters.

According to one embodiment, when the central controller 500 starts receiving an incoming message transmitted by an SPPS 100, a logic in the receiver detects the reception of the SYNC field 402 and generates a pulse 512 which may be time stamped by the clock or timer 503. This time stamp is denoted $T_3$. Hence, having the $T_3$ and $T_4$ time stamps and the information received in the message transmitted by the SPPS 100, the central controller 500 can determine the time delay between the current and voltage signals as follows:

$$T_{VID}=T_{VZC}-T_{Pzc}=T_{VZC}-T_3+T_{cycle}-T_{CTD}-T_{FD}-(\text{Delta } T)-T_{TD}-T_{RD}-T_{SBD}$$

where: $T_{VID}$ is the time difference between the zero-crossing time stamp of the input voltage signal and the primary input current signal 102 zero-crossing. The time stamp is according to the central controller 500 time base (timer); $T_{VZC}$ is the zero-crossing time stamp of the input voltage signal 515 in the central controller 500; $T_{PZC}$ is the zero-crossing time stamp of the primary input signal 102 in the SPPS 100. The time stamp is according to the central controller 500 time base (timer); $T_3$ is the time stamp of the received SYNC field 402 at the central controller 500; $T_{cycle}$ is the cycle time of the input signal (e.g. 20 msec for a 50 Hz signal); $T_{CTD}$ is the time delay of the current transformer; $T_{FD}$ is the time delay of the SPPS filter (if used); Delta T is the value of $T_2$-$T_1$ as computed by the SPPS 100; $T_{TD}$ is the time delay of the SPPS transmitter; $T_{RD}$ is the time delay of the bridge receiver; and, $T_{SBD}$ is the propagation time of the wireless message. Since the time stamp of the input voltage $T_{VZC}$ may be performed by the central controller (e.g. bridge) 500 after or before the determined time stamp of the input current $T_{Pzc}$, the computed value $T_{VID}$ may require an adjustment as follows (the delay cannot be more than +/−0.25*$T_{cycle}$): if $T_{VID}$<0, then add an integer number of quarter cycles (i.e. N*0.25*$T_{cycle}$) until the number is positive and <0.25*$T_{cycle}$; if $T_{VID}$>0.25*$T_{cycle}$, then subtract an integer number of quarter cycles (i.e. N*0.25*$T_{cycle}$) until the number is positive and <0.25*$T_{cycle}$; and, if $0 \le T_{VID} \le 0.25*T_{cycle}$, then no need to adjust $T_{VID}$.

In one embodiment, the cycle time of the input voltage signal (i.e., the power line frequency) may be estimated based on the time stamped samples 517. Since the line frequency is not expected to change at short intervals, this estimation may be performed at intervals of a minute or more. In another embodiment, as the line frequency is kept relatively constant by the power provider (for example, at a 50 Hz grid the frequency may not change by more than 0.25 Hz—i.e., 0.5%), a constant value of $T_{cycle}$ can be used and stored in the central controller 500 without measuring it periodically. In another embodiment, the central controller 500 may be periodically updated from a server though an Ethernet link 518, which can accurately measure the line frequency in a site and update all the central controllers 500 in the site. After the voltage-current delay has been determined, the phase difference ϕ between the input voltage and the input current is computed as follows:

$$\phi[\text{degrees}]=360*(T_{VID}/T_{cycle})$$

$$\phi[\text{radians}]=2\pi*(T_{VID}/T_{cycle},$$

In one embodiment, the central controller 500 may also include a low pass filter, implemented as a digital filter in the MC or as an external filter (not shown), generating another signal (not shown) that contains only the fundamental frequency of the voltage. This signal will also be measured by the A/D 506 and then the ratio Vf[RMS]/Vs can be computed [RMS]. However, in some cases this stage is not necessary assuming the input voltage distortion is relatively negligible. According to the disclosure, the power factor can then be computed in the central controller 500 using the computed cos ϕ as well as other parameters $V_s$[RMS], $I_s$[RMS], $V_f$[RMS], $I_f$[RMS]. The power factor can then be used to determine the power consumption of the load. The central controller 500 can handle simultaneously the computation of cos ϕ for multiple SPPS units. According to one embodiment, the computed phase difference ϕ or the resulting cos ϕ or power factor may be sent by the central controller (e.g. bridge) 500 to a management server (not shown). This information, along with other parameters from both the SPPS 100 and the central controller (e.g. bridge) 500, such as (but not limited to) Vs[RMS], Is[RMS], Vf[RMS], If[RMS] can be sent to the management server 519 using an Ethernet adapter 504 coupled to the MC 502.

Many other communication means may be used by the bridge to transfer this information to the server, including and without limitation, IEEE802.11/a/b/g/n/ac/ad networks, IEEE802.15.4, cellular 3G/4G/5G networks, USB, and their like.

Figure 6:
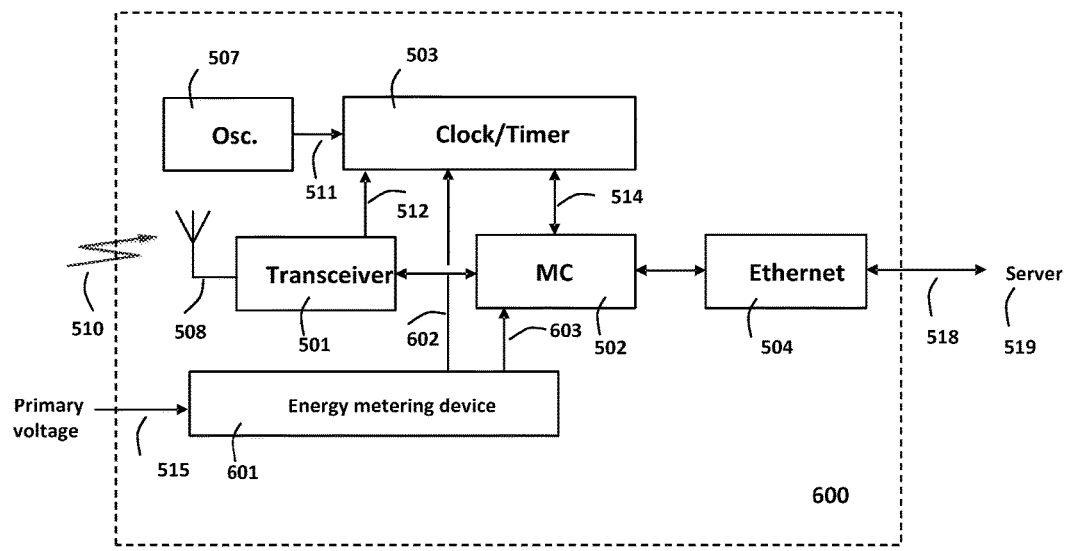
FIG. 6 is an exemplary central controller according to another embodiment.

Reference is now made to FIG. 6 where an example central controller 600 according to a fifth embodiment is shown. The central controller 600, which may be embodied as a bridge, includes similar functions as described in FIG. 5, but differs in the way the zero-crossing of the input voltage 515 is detected. According to one embodiment, the communication bridge MC 502 is coupled to an energy metering device 601 which includes a circuit to detect the zero-crossing of the primary voltage signal 515. In such embodiment, the energy metering device 601 is configured to generate a digital signal 602 which is directly related to the time of the zero-crossing. Depending on the selected metering device, the generated pulse 602 may have a fix delay ($T_{MD}$) in respect to the zero-crossing time. This delay $T_{MD}$ is taken into account by the central controller (e.g. bridge) 600 when determining the overall time difference between the line voltage and line current. The above energy metering device may also measure $V_f$[RMS] and $V_s$[RMS] that can be used for the power factor computation.

Figure 7:
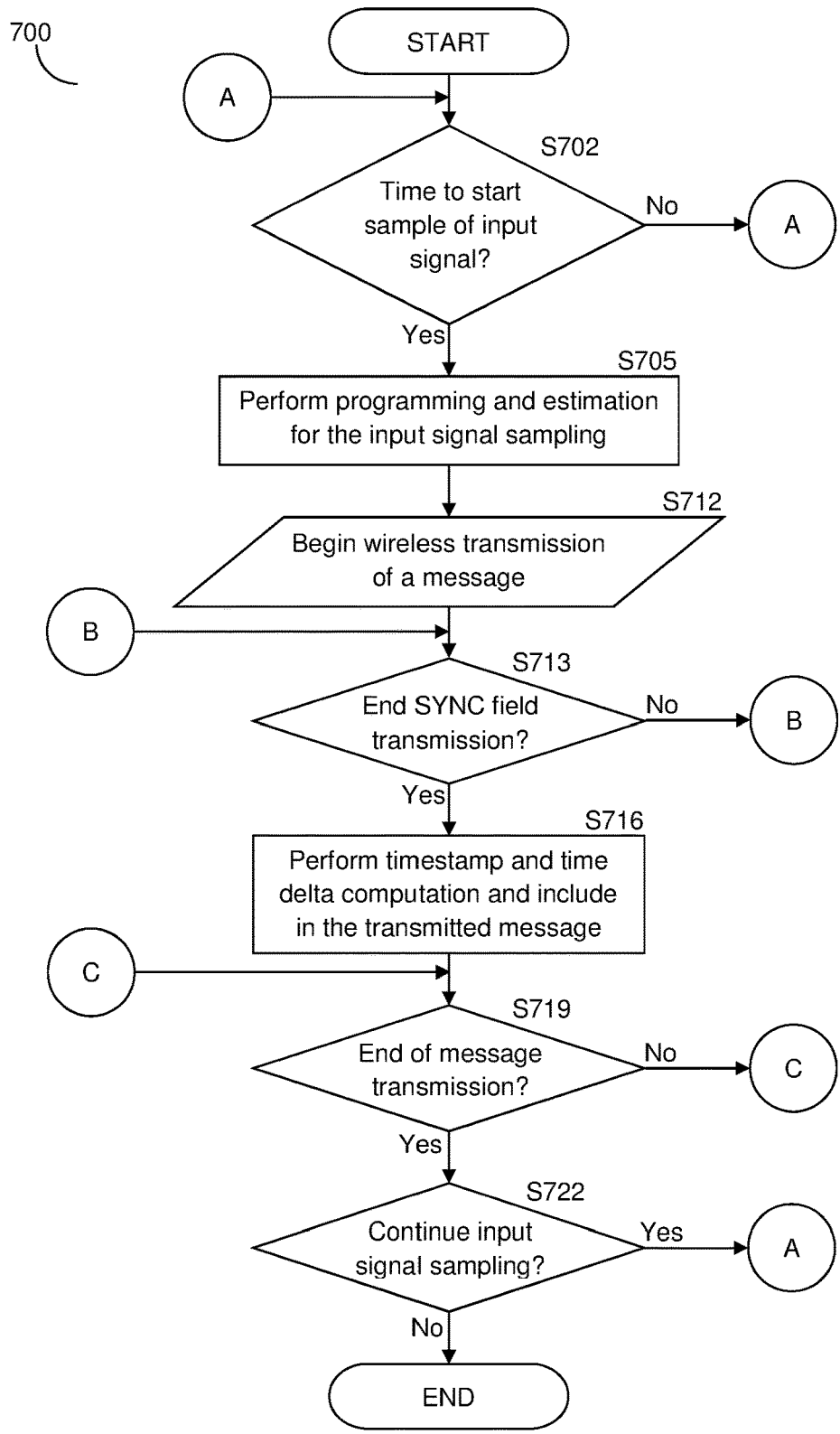
FIG. 7 is a flowchart of a first method for providing synchronization information according to an embodiment.

FIG. 7 depicts an example flowchart 700 of a method for providing synchronization information according to one embodiment. The method starts after the SPPS 100 has been initialized. As part of that initialization, a clock or timer 113 is programmed to send a wake-up trigger to the MC 107 at periodic intervals (e.g., every second).

At S702, it is determined if it is time to sample the input current signal. If so, the input current signal is sample at S705 (e.g., via the clock or timer 113 and the ADC 105). Otherwise, the method begins again.

After N samples (e.g., 32 samples for a 50 Hz signal) have been stored, e.g., in the MC 107 memory, the time of the start of the input signal cycle (Ts) is estimated. This is possible since the time when the sampling process began had been recorded. Having an estimate of the start of the cycle, a new sampling process is initiated (e.g., 32 samples for a 50 HZ signal via the clock or timer 113), but with the difference that the start of this sampling process is triggered by the clock or timer 113 itself (i.e., not by an MC command). The outcome of this hardware trigger is having an accurate time stamp of the new samples, limited only by the clock or timer accuracy. After the sampling process is completed and the samples are stored, e.g., in memory, the zero-crossing time $T_1$ of the input signal 104 is estimated, e.g., by the MC 107.

In one embodiment, the zero-crossing point ($T_1$) estimation may be done by linear interpolation or extrapolation, or may include more sophisticated and accurate methods like non-linear regression or similar methods. For example, in a linear approximation, linear regression can be applied to the last two samples prior to the zero-crossing, represented by samples Sa and Sb and times Ta and Tb accordingly, to find the constants a and b of a linear equation S=a*$T_+$b representing the part of the signal that is close to the zero-crossing. Applying S=0 will yield $T_1$ which is the zero-crossing point. In another embodiment $T_1$ can be taken simply as the time of the first sample where the sample value changes sign between positive and negative or vice versa, or the average of the times of the two samples in which the analog signal changes sign, although the latter two may be less accurate if sampling rate is not high enough.

In certain embodiments, estimating the zero-crossing point with an accuracy of ±0.5° may be sufficient for estimating the power factor, while other embodiments may require different levels of accuracy. The zero-crossing evaluation may be done using continuous sampling of a few cycles of the signal, without prior estimation of the time of the start of the signal or going into allowing the MC to enter into standby mode. According to one embodiment as depicted in flowchart 700, the RMS value of the input signal 102 and the RMS value of a filtered signal (i.e., the fundamental component) are computed. Those values may be determined using the respective signal samples and the filtered samples. This is needed to compute more accurately the power factor according to the following approximation:

$$PF = \frac{Vf[RMS]}{Vs[RMS]} * \frac{If[RMS]}{Is[RMS]} * \cos(\phi) = DF_V * DF_I * \cos(\phi)$$

where, $I_s$ [RMS] is the RMS value of the input (non-filtered) signal; $I_f$ [RMS] is the RMS value of the fundamental component of the input signal; $V_s$ [RMS] is the RMS value of the voltage; $V_f$ [RMS] is the RMS value of the fundamental component of the voltage; cos (ϕ) is the displacement power factor, or the power factor of the fundamental signal; $DF_v$ is the voltage distortion factor that may be determined, for example, by the central controller; $DF_I$ is the current distortion factor that may be computed, for example, by the SPPS; and, PF is the true power factor.

Upon determination that a transmission is to take place, a message is prepared to be transmitted. The message is typically a single packet of data that may contain various types of information and include the SPPS's unique identification (UID) which enables a central controller 500 to positively associate the current data received with previous data handled by the central controller with respect of the SPPS 100 (e.g., the message 400 of FIG. 4). At S712, without interrupting the clock or timer operation 113 (to avoid losing synchronization to the time-stamped samples and estimated zero-crossing time $T_1$), a wireless message is transmitted, e.g., to a central controller 500. The transmitted message may include different fields of information.

It should be noted that one of the message fields may be a SYNC field 402 which is typically transmitted following the message preamble 401. Once the message 400 transmission started, the MC waits, at S713, until the SYNC field is transmitted. When this happens, the time of the end of transmission of the SYNC field is sampled at S716, e.g, by the clock or timer 113. The SYNC field 402 allows an accurate time-stamping by the clock or timer 113 of the message transmission time ($T_2$). The message 400 packet may include, without limitations, various SPPS status information, hardware version, software version, alerts such as overload, average current, SPPS temperature, time-stamped samples, input signal characteristics, power off indication, e.g., upon identification that the load was turned off, and other system parameters. While the message 108 is transmitted, the time difference between the SYNC field transmission $T_2$ and the estimated zero-crossing $T_1$ of the sampled signal 106 is determined. This time is denoted as Delta T:

$$\text{Delta } T = T_2 - T_1$$

As may be apparent to the skilled in the art, computing Delta T may include handling the wraparound of the timer 113, between $T_1$ and $T_2$. In one embodiment, additional auxiliary bits may be added to the message data 403 prior to the Delta T value in order to allow sufficient time for the MC to determine delta T and insert it to the message on the fly. According to one embodiment, as depicted in flowchart 700, the MC 107 estimates Delta T and inserts this value and the values of $I_s$ and $I_f$ in the message 400 packet being transmitted.

At S719, it is determined if the entire message has been transmitted and when this happens, at S722 it is checked if there is need to continue signal sampling; if that is determined to be necessary, the flow returns to S702 to wait for the start of a new measurement cycle; otherwise it ends its execution. According to the implementation, this may incur reprogramming of the clock or timer 113 as previously explained.

Figure 8:
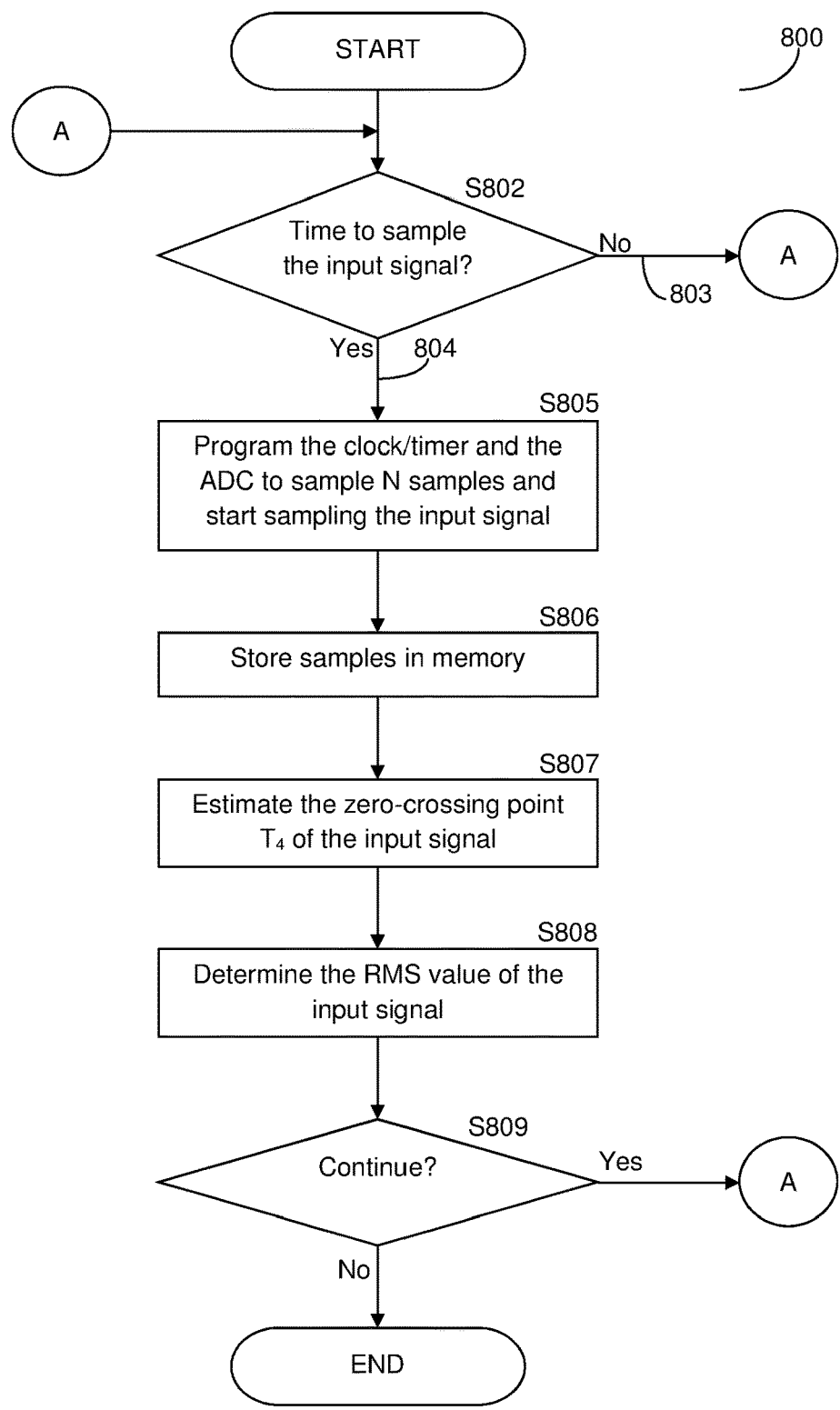
FIG. 8 is a flowchart of a second method for providing synchronization information according to an embodiment.
Figure 9:
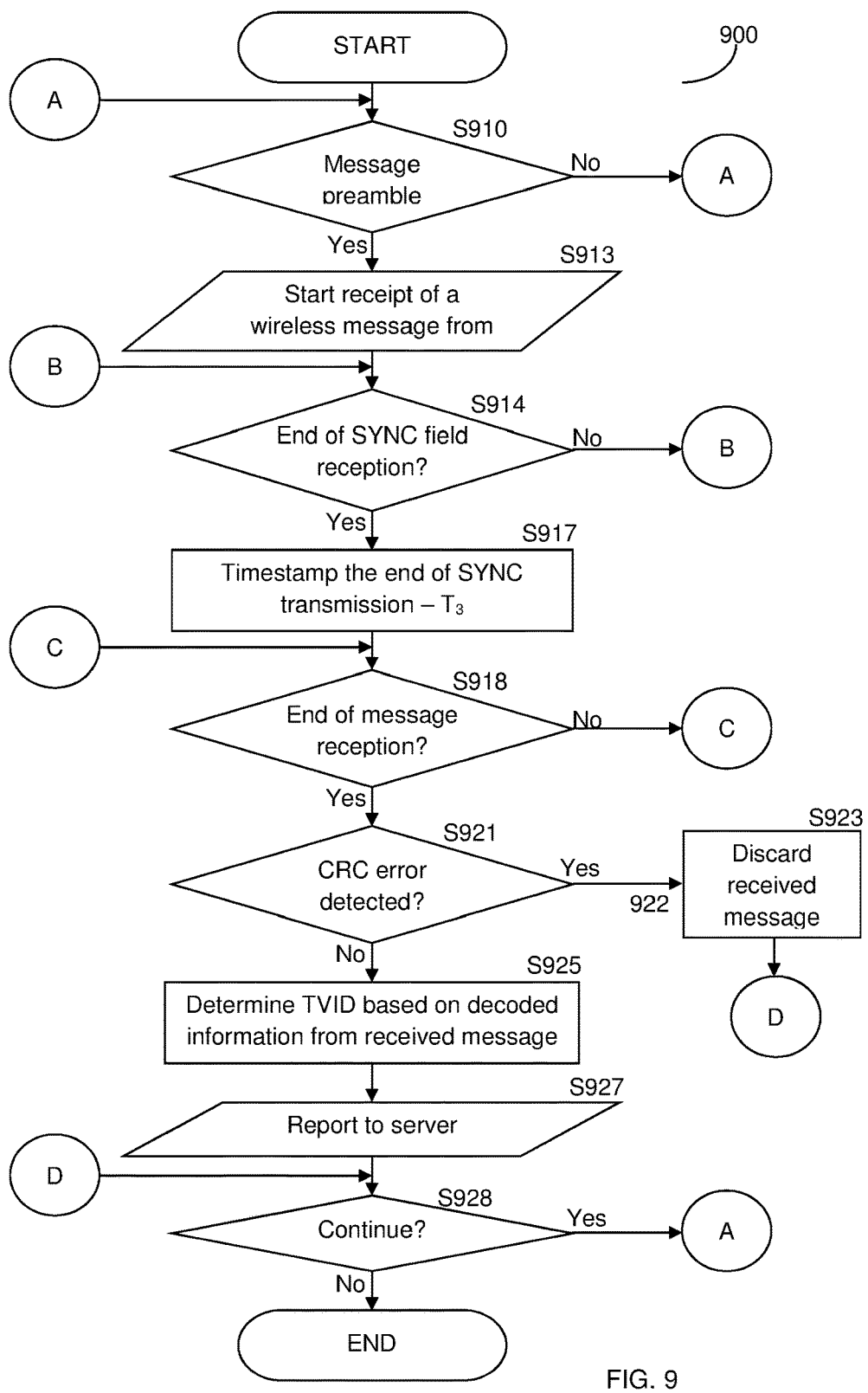
FIG. 9 is a flowchart of a third method for providing synchronization information according to an embodiment.

Reference is now made to FIGS. 8 and 9, where FIG. 8 depicts example flowcharts 800 and 900 providing synchronization information according to various embodiment. For the sake of clarity, the flowcharts 800 and 900 only describe flow elements that are needed for the purpose of explaining the methods while other flow elements are omitted. Furthermore, merely for the sake of clarity, the flowcharts are divided into two parallel flows, flowchart 800 and flowchart 900. The two flows will be explained separately but it should be understood, that the flows are executed concurrently, for example, but not by way of limitation, by an operating system managing several tasks.

At S802 it is determined if it is time to start sampling the input voltage signal, e.g., signal 515. If so, at S805 the input voltage signal 515 is sampled, e.g., via the clock or timer 503 and the ADC 506; otherwise, execution waits at S802.

At S806, samples are stored, e.g., in a memory. After N samples (e.g., 64 samples for a 50 Hz signal) have been stored, e.g., in memory of MC 502, the time of the start of the input signal cycle ($T_4$) is estimated at S807. This is possible since the time when the sampling process has started has been recorded. The start of this sampling process is triggered by the clock or timer 503 itself (i.e., not by an MC command). The outcome of this hardware trigger is having an accurate time stamp of the new samples, limited only by the clock or timer accuracy.

At option S808, the RMS value of the input voltage signal 515 is computed. Thereafter, at S809 it is checked whether to continue and if so execution continues with S802; otherwise, execution ceases.

According to an embodiment shown in flowchart 900, at S910 it is determined if there has been receipt of a new wireless message preamble. When a message preamble is detected, the incoming wireless message is received at S913, e.g., over wireless transmission. Following the receipt of the message preamble, it is determined if there is receipt of the SYNC field. If so, the end of the SYNC field reception is time stamped at S917. This time stamp may be denoted as $T_3$. At S918, it is determined if the message has been fully received. It then checked at S921 if the message has been received successfully without uncorrectable errors, e.g., cyclic redundancy code (CRC) errors. If the received message does contains uncorrectable errors, then the received message is discarded at S923 and the process continues with S928.

If the received message has no errors, then the values of $I_s$ and $I_f$ of the input current are decoded at S925 together with the value of Delta T. Now, having the T3 and T4 time stamps and the information received in the message 400 transmitted by the SPPS 100, the MC 502 can determine the time delay between the current and voltage signals as follows:

$$T_{VID} = T_{VZC} - T_{Pzc} = T_{VZC} - T_3 + T_{cycle} - T_{CTD} - T_{FD} - (\text{Delta } T) - T_{TD} - T_{RD} - T_{SBD}$$

where: $T_{VID}$: Time difference between the zero-crossing time stamp of the input voltage signal and the primary input current signal 102. The time stamp is according to the central controller 500 time base (timer); $T_{VZC}$: Zero-crossing time stamp of the input voltage signal 515 in the central controller 500; $T_{PZC}$: Zero-crossing time stamp of the primary input signal 102 in the SPPS 100. The time stamp is according to the central controller 500 time base (timer); $T_3$: Time stamp of the received SYNC field 402 at the central controller 500; $T_{cycle}$: Cycle time of the input signal (e.g. 20 msec for a 50 Hz signal); $T_{CTD}$: Time delay of the current transformer; $T_{FD}$: Time delay of the SPPS filter (if used); Delta T: The value of $T_2$-$T_1$ as computed by the SPPS 100; $T_{TD}$: Time delay of the SPPS transmitter; $T_{RD}$: Time delay of the bridge receiver; and, $T_{SBD}$: Propagation time of the wireless message.

It should be noted that since the time stamp of the input voltage $T_{VZC}$ may be performed after or before the determined time stamp of the input current $T_{Pzc}$, the computed value $T_{VID}$ may require an adjustment as follows (the delay cannot be more than +/−0.25*$T_{cycle}$): if $T_{VID}$<0, then add an integer number of quarter cycles (i.e. N*0.25*$T_{cycle}$) until the number is positive and <0.25*$T_{cycle}$; if $T_{VID}$>0.25*$T_{cycle}$, then subtract an integer number of quarter cycles (i.e. N*0.25*$T_{cycle}$) until the number is positive and <0.25*$T_{cycle}$; and, if 0≤$T_{VID}$≤0.25*$T_{cycle}$, then no need to adjust $T_{VID}$.

At S927, the values of $T_{VID}$, $I_s$ and $I_f$ of the input current signal and $V_s$ of the input voltage signal at reported to a server. Such values allow a server to compute the power factor cos (φ). Once the reporting to the server at S927 is completed, it is checked whether to continue execution at S928, and if so, execution continues with S910, waiting for the reception of a new SPPS message; otherwise, execution terminates.

Figure 10:
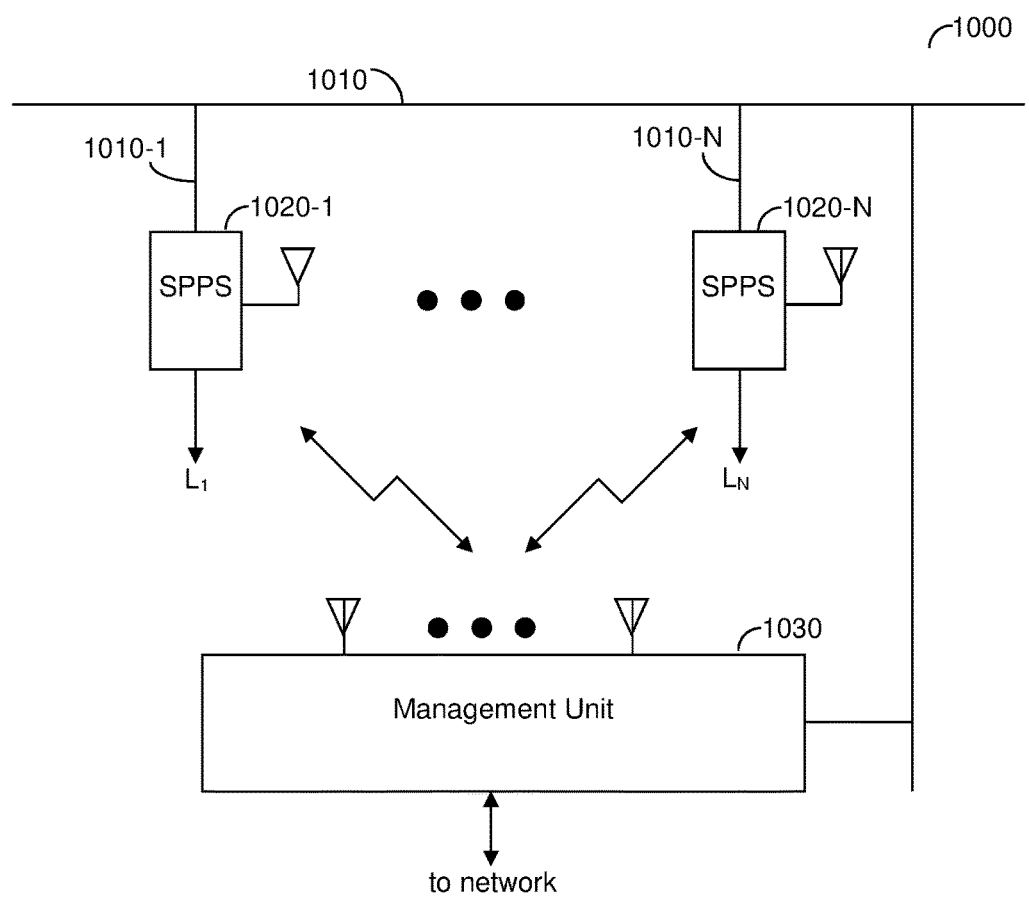
FIG. 10 is a diagram of a system including a plurality of SPPSs wirelessly connected to a central controller according to an embodiment.

FIG. 10 is an example diagram of a system 1000 including a plurality of self-powered power sensors (SPPSs) 1020 wirelessly connected to a central controller 1030 according to an embodiment. The SPPS 1020-1 to 1020-N, where N is a positive integer, may be, for example, any of the SPPSs shown in FIGS. 1 through 3, or others that may be adapted to perform the teachings of the instant disclosure.

A power line 1010 distributes current to the plurality of SPPS 1020-1 through 1020-N through distribution lines 1010-1 through 1010-N respectively. A portion of each of the distribution lines 1010-1 through 1010-N that run through the core of their respective SPPSs 1020-1 through 1020-N act as a respective primary winding. Thereafter the line provides the current to respective loads (not shown) marked as $L_1$ through $L_N$. The SPPSs 1020 are wirelessly connected to a central controller 1030, the operation of which has been discussed in detail elsewhere herein, for the transfer of packets with information of both electrical parameters and timing information. The central controller 1030 is further connected to the power line 1010 for the purpose of sampling the voltage signal as discussed in more detail elsewhere herein. In one embodiment the central controller may be further connected to a network, which may include, but is not limited to a local area network (LAN), wide area network (WAN), metro area network (MAN), the Internet, the worldwide web (WWW), wired or wireless, and the like.

The central controller 1030 may include a processing unit (not shown) and a memory (not shown) connected to the processing unit. The memory may store therein a plurality of instructions that when executed by the processing unit perform the tasks described elsewhere herein. The central controller further includes one or more antenna for the wireless communication with the one or more SPPSs 1020. In one embodiment a transceiver is used rather than a receiver alone, allowing the central controller 1030 to communicate with any SPPS 1020, for example, but not by way of limitation, performing one or more of the computations discussed herein at the SPPS 1020.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine including any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A self-powered power sensor (SPPS) adapted for the purpose of performing value corrections to calculated electrical parameters, the SPPS comprising:
   a current transformer, where a primary winding of the current transformer is a powerline;
   an analog-to-digital converter (ADC) connected to the secondary winding of the current transformer;
   a wireless transmitter;
   a processing unit connected to the ADC and configured to:
      sample an electrical signal off of the secondary winding of the current transformer;
      estimate a time-stamp based on the sampled electrical signal;
      estimate at least a first electrical parameter;
      generate a preamble of a packet;
      generate a synchronization information for the synchronization field of the packet;
      cause the transmitter to transmit the packet components comprising the preamble, the synchronization field and the at least a first electrical parameter to a central controller;
      determine a time offset value for the packet, the time offset calculated from the time-stamp and the transmission time-stamp of the synchronization information; and
      cause the transmitter to transmit the time offset value by appending it to the packet, wherein the time offset value is used for the purpose of calculating of at least second electrical parameter; and
   a clock connected to an oscillator, wherein the clock is connected to the ADC, the processing unit and the transmitter.

2. The SPPS of claim 1, wherein the second electrical parameter is a phase shift.

3. The SPPS of claim 1, wherein the second electrical parameter is a power factor.

4. The SPPS of claim 1, wherein sampling the electrical signal and estimating a time-stamp based on the sampled electrical signal comprises:
   sampling a current signal by the SPPS; and
   sampling a voltage signal.

5. The SPPS of claim 4, wherein sampling a voltage signal is performed by the central controller.

6. The SPPS of claim 4, further configured to:
   determine a phase offset between the sampled current signal and the sampled voltage signal.

7. The SPPS of claim 6, further configured to:
   determine a power factor using the phase offset, the sampled current signal and the sampled voltage signal.

8. The SPPS of claim 7, further configured to:
determine a current distortion factor for the power factor using the sampled current signal and the sampled voltage signal.

9. The SPPS of claim 7, further configured to:
determine a voltage distortion factor for the power factor.

10. The SPPS of claim 6, wherein the first electrical parameter is a time stamp at a zero crossing point of the current signal.

11. The SPPS of claim 6, wherein the first electrical parameter is a time stamp at a maximum point of the current signal.

12. The SPPS of claim 6, wherein the first electrical parameter is a time stamp at a minimum point of the current signal.

13. The SPPS of claim 1, wherein the packet components include the preamble, the synchronization field and the at least a first electrical parameter to a central controller.

\* \* \* \* \*